(12) United States Patent
Lin et al.

(10) Patent No.: US 9,431,613 B2
(45) Date of Patent: Aug. 30, 2016

(54) METHOD OF FABRICATING PEROVSKITE SOLAR CELL

(71) Applicant: National Tsing Hua University, Hsinchu (TW)

(72) Inventors: Hao-Wu Lin, Hsinchu (TW); Chang-Wen Chen, Hsinchu (TW); Hao-Wei Kang, Hsinchu (TW); Sheng-Yi Hsiao, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/601,239

(22) Filed: Jan. 21, 2015

(65) Prior Publication Data

US 2016/0049585 A1 Feb. 18, 2016

(30) Foreign Application Priority Data

Aug. 13, 2014 (TW) .............................. 103127779 A

(51) Int. Cl.
*H01L 21/00* (2006.01)
*H01L 51/00* (2006.01)
*H01L 51/42* (2006.01)

(52) U.S. Cl.
CPC ........... *H01L 51/005* (2013.01); *H01L 51/001* (2013.01); *H01L 51/4253* (2013.01); *Y02E 10/549* (2013.01)

(58) Field of Classification Search
USPC ........................................................ 438/82
See application file for complete search history.

(56) References Cited

U.S. PATENT DOCUMENTS

2015/0249170 A1* 9/2015 Snaith .................. H01L 51/422
136/256

FOREIGN PATENT DOCUMENTS

| CN | 103346018 | 10/2013 |
|---|---|---|
| CN | 103441217 | 12/2013 |
| CN | 103474574 | 12/2013 |
| CN | 103474575 | 12/2013 |
| CN | 103490011 | 1/2014 |
| CN | 103681886 | 3/2014 |
| CN | 103682153 | 3/2014 |
| CN | 103746078 | 4/2014 |
| CN | 103956392 | 7/2014 |
| EP | 2693503 | 2/2014 |

(Continued)

OTHER PUBLICATIONS

Eperon et al., "Morphological Control for High Performance, Solution-Processed Planar Heterojunction Perovskite Solar Cells," Advanced Functional Materials, Jan. 8, 2014, pp. 151-157.

(Continued)

*Primary Examiner* — Timor Karimy
(74) *Attorney, Agent, or Firm* — Jianq Chyun IP Office

(57) ABSTRACT

A method of fabricating a perovskite solar cell includes forming a hole transport layer on a transparent electrically conductive substrate, and forming a perovskite layer on the hole transport layer via a two-stage vacuum evaporation process. Then, an electron transport layer and an electrode layer are formed in order. The two-stage vacuum evaporation process includes first vacuum evaporating a first material on the hole transport layer and then vacuum evaporating a second material on the first material so as to react the first material with the second material in situ and form the perovskite layer.

12 Claims, 5 Drawing Sheets

(56) References Cited

FOREIGN PATENT DOCUMENTS

| TW | 201213378 | 4/2012 |
|---|---|---|
| WO | 2014003294 | 1/2014 |
| WO | 2014020499 | 2/2014 |

OTHER PUBLICATIONS

Lee et al., "Efficient Hybrid Solar Cells Based on Meso-Superstructured Organometal Halide Perovskites," Science, Nov. 2, 2012, pp. 643-647.

Wojciechowski et al., "Sub-150° C processed meso-superstructured perovskite solar cells with enhanced efficiency," Energy & Environmental Science, Jan. 2, 2014, pp. 1142-1147.

Conings et al., "Perovskite-Based Hybrid Solar Cells Exceeding 10% Efficiency with High Reproducibility Using a Thin Film Sandwich Approach," Advanced Functional Materials, Apr. 2, 2014, pp. 2041-2046.

Docampo et al., "Efficient organometal trihalide perovskite planar-heterojunction solar cells on flexible polymer substrates," Nature Communications, Nov. 12, 2013, pp. 1-6.

Eperon et al., "Neutral Color Semitransparent Microstructured Perovskite Solar Cells," ACS NANO, Dec. 10, 2013, pp. 591-598.

Liu et al., "Efficient planar heterojunction perovskite solar cells by vapour deposition," Nature, Sep. 19, 2013, pp. 395-398.

Malinkiewicz et al., "Perovskite solar cells employing organic charge-transport layers," Nature Photonics, Dec. 22, 2013, pp. 128-132.

Burschka et al., "Sequential deposition as a route to high-performance perovskite-sensitized solar cells," Nature, Jul. 18, 2013, pp. 316-319.

Bi et al., "Using a two-step deposition technique to prepare perovskite (CH3NH3PbI3) for thin film solar cells based on ZrO2 and TiO2 mesostructures," The Royal Society of Chemistry, Jul. 24, 2013, pp. 18762-18766.

Chen et al., "Planar Heterojunction Perovskite Solar Cells via Vapor-Assisted Solution Process," J Am Chem Soc., Dec. 20, 2013, pp. 622-625.

Chen et al., "Efficient and Uniform Planar-Type Perovskite Solar Cells by Simple Sequential Vacuum Deposition," Advanced Materials, Oct. 15, 2014, pp. 6647-6652.

"Office Action of Taiwan Counterpart Application", issued on Nov. 20, 2015, p. 1-p. 6, in which the listed references were cited.

* cited by examiner

METHOD OF FABRICATING PEROVSKITE SOLAR CELL

CROSS-REFERENCE TO RELATED APPLICATION

This application claims the priority benefit of Taiwan application serial no. 103127779, filed on Aug. 13, 2014. The entirety of the above-mentioned patent application is hereby incorporated by reference herein and made a part of this specification.

BACKGROUND OF THE INVENTION

1. Field of the Invention

The invention is related to a solar cell technique, and more particularly, to a method of fabricating a perovskite solar cell.

2. Description of Related Art

The development of the perovskite solar cell originated from the dye-sensitized solar cell (DSSC). The most common perovskite material in a high-efficiency perovskite-type solar cell is $CH_3NH_3PbI_3$, it has a bandgap of about 1.5 eV and a high extinction coefficient, and a thin film thereof having a thickness of several hundred nanometers is sufficient to fully absorb sunlight of 800 nm or less.

Therefore, manufacturers have currently invested a lot of resources to research the perovskite solar cell, and a wet process is mostly used in the information disclosed by the manufacturers. However, the wet process is often limited by issues such as low material (such as $PbI_2$ or $PbCl_2$) dissolution and small selection of solvent. Moreover, a method of co-evaporation has been adopted in laboratories to fabricate a lead iodide methylamine layer. However, it is discovered that the obtained solar cell is unstable in terms of conversion efficiency.

SUMMARY OF THE INVENTION

The invention provides a method of fabricating a perovskite solar cell. The method may fabricate a solar cell having high conversion efficiency in a stable manner.

A method of fabricating a perovskite solar cell of the invention includes forming a hole transport layer on a transparent electrically conductive substrate, and then forming a perovskite layer on the hole transport layer via a two-stage vacuum evaporation process. Then, an electron transport layer is formed on the perovskite layer, and an electrode layer is formed on the electron transport layer. The two-stage vacuum evaporation process includes: first vacuum evaporating a first material on the hole transport layer and then vacuum evaporating a second material on the first material so as to react the first material with the second material in situ and form the perovskite layer.

In an embodiment of the invention, the perovskite layer includes a structure of the following formula:

$$ABX_3$$

wherein B includes $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$; X is each independently selected from $Cl^-$, $Br^-$, $I^-$, $NCS^-$, $CN^-$, or $NCO^-$; A includes $Li^+$, $Na^+$, $Cs^+$, $Rb^+$, or $K^+$, or A is selected from hydrocarbons having 1 to 15 carbons and 1 to 20 heteroatoms, and the heteroatom is at least one selected from N, O, and S.

In an embodiment of the invention, the perovskite layer may be $CH_3NH_3PbX_3$, wherein X is each independently selected from $Cl^-$, $Br^-$, or $I^-$.

In an embodiment of the invention, the first material includes an inorganic material such as $PbI_2$, $PbCl_2$, $PbBr_2$, $SnI_2$, $SnCl_2$, $SnBr_2$, $GeI_2$, $GeCl_2$, or $GeBr_2$.

In an embodiment of the invention, the second material includes an organic or inorganic material such as $CH_3NH_3I$, $CH_3NH_3Br$, $NH_4I$, $NH_4IBr$, $HC(NH_2)_2I$, CsI, CsBr, RbI, RbBr, KI, KBr, NaI, NaBr, LiI, or LiBr.

In an embodiment of the invention, a method of vacuum evaporating the second material on the first material includes vertical evaporation or horizontal evaporation. When the second material is vacuum evaporated via a method of vertical evaporation, the temperature of the transparent electrically conductive substrate is above room temperature, such as 40° C. to 200° C.

In an embodiment of the invention, during the vacuum evaporation of the first material on the hole transport layer, an acceptor material may optionally be evaporated at the same time.

In an embodiment of the invention, after the perovskite layer is formed, a post-annealing process may further be performed.

In an embodiment of the invention, during vacuum evaporating the second material, a shutter may be used to prevent the second material directly depositing on the first material.

In an embodiment of the invention, during vacuum evaporating the second material, the walls of a chamber may be heated, and the transparent electrically conductive substrate is placed in the chamber to perform the vacuum evaporating step.

Based on the above, in the invention, a two-stage vacuum evaporation process is used for the method of fabricating the perovskite layer. Therefore, the evaporation parameters of the first material and the second material may respectively be precisely controlled, such as the evaporation temperature and the evaporation rate. As a result, not only may all of the disadvantages of a wet process be avoided, a stable perovskite solar cell having high conversion efficiency may further be obtained.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
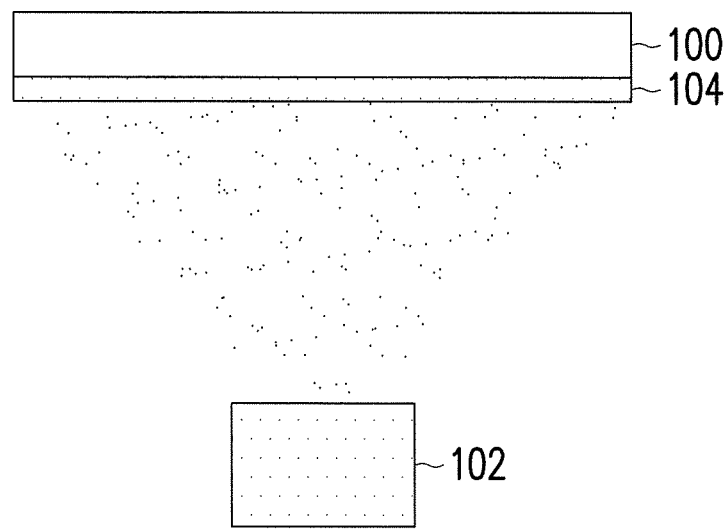
FIG. 1 to FIG. 2B are cross-sectional schematics of a fabrication process of a perovskite solar cell according to an embodiment of the invention.
Figure 2A:
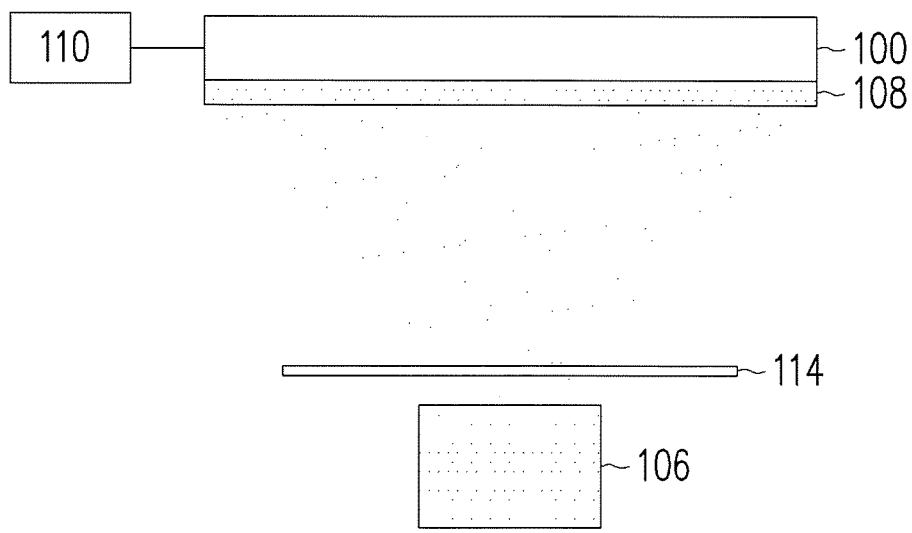
Figure 2B:
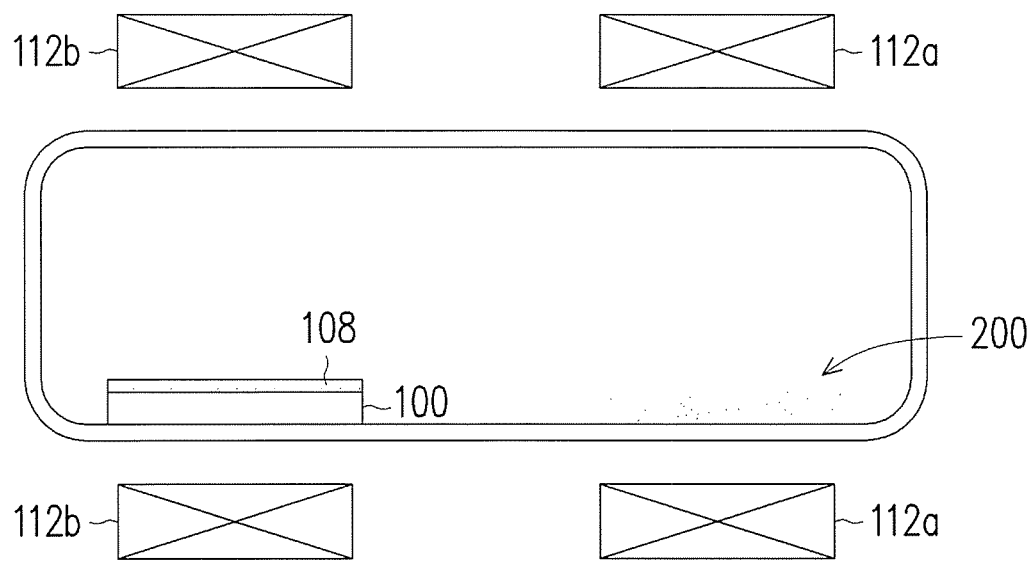

FIG. 1 to FIG. 2B are cross-sectional schematics of a fabrication process of a perovskite solar cell according to an embodiment of the invention, wherein steps of the fabrication of a perovskite layer are shown.

Referring to FIG. 1, a hole transport layer (HTL) is first formed on a transparent electrically conductive substrate to obtain a transparent electrically conductive substrate 100 in FIG. 1 coated with an HTL. In the present embodiment, the so-called "transparent" means transparent to at least a part. For instance, the transparent electrically conductive substrate 100 may be transparent to visible light or non-visible light (such as ultraviolet light or infrared light). The transparent electrically conductive substrate 100 is, for instance, a glass or a plastic on which an electrically conductive material layer such as indium tin oxide (ITO), fluorine-doped tin oxide (FTO), $ZnO-Ga_2O_3$, $ZnO-Al_2O_3$, $Sn-O$, antimony-doped tin oxide (ATO), $SrGeO_3$, or zinc oxide is coated. The HTL on the transparent electrically conductive substrate may include an inorganic or an organic HTL. In an embodiment, the HTL is, for instance, an HTL of a non-perovskite structure. In the case of an organic HTL, the so-called "organic" does not exclude the inclusion of other components. For instance, the other components may be selected from (i) one or more dopants, (ii) one or more solvents, (iii) one or more additives such as an ionic compound, and a combination thereof. For instance, the organic HTL may include the other components (i), (ii), and (iii) respectively in an amount of 0 wt % to 30 wt %, 0 wt % to 20 wt %, and 0 wt % to 10 wt %, and the amounts are preferably all between 0 wt % and 5 wt %.

Then, to form a perovskite layer, in the invention, a two-stage vacuum evaporation process is used. First, as shown in FIG. 1, a first material is placed in an evaporation source 102, and then it is coated on the surface of the transparent electrically conductive substrate 100 having an HTL via a vacuum evaporation. Accordingly, a film layer 104 of a first material 104 is formed. The first material is an inorganic material such as $PbI_2$, $PbCl_2$, $PbBr_2$, $SnI_2$, $SnCl_2$, $SnBr_2$, $GeI_2$, $GeCl_2$, or $GeBr_2$.

Then, referring to FIG. 2A and FIG. 2B, a second material is placed in an evaporation source 106 or 200, and then it is coated on the first material (i.e. 104 in FIG. 1) via vacuum evaporation such that the first material is reacted with the second material to form a perovskite layer 108. The second material includes an organic material or an inorganic material such as $CH_3NH_3I$, $CH_3NH_3Br$, $NH_4I$, $NH_4IBr$, $HC(NH_2)_2I$, CsI, CsBr, RbI, RbBr, KI, KBr, NaI, NaBr, LiI, or LiBr. Moreover, FIG. 2A is a schematic of vertical equipment such as heater 110 or heaters 112a-112b, the temperature of the transparent electrically conductive substrate 100 may be controlled above room temperature (e.g. 40° C. to 200° C.) in both vertical and horizontal evaporation. Moreover, during the vacuum evaporation for coating the second material, a shutter 114 is optionally used for preventing the second material from directly depositing on the first material, wherein the shutter 114 may be disposed between the evaporation source 106 (or 200 of FIG. 2B) and the surface of the transparent electrically conductive substrate 100. The shutter 114 can stop the second material from depositing in the form of molecule, and thus the first material prefers to react with the gaseous second material.

Accordingly, the second material would be not directly present in the perovskite layer 108, and it is expected that the perovskite layer 108 has better crystalline property. In addition, the vacuum evaporation process is always performed in a chamber, i.e. the transparent electrically conductive substrate 100 is placed in the chamber for the vacuum evaporation. The walls of the chamber may be heated during the vacuum evaporation for coating the second material, and therefore it may prevent the second material from depositing on the walls of the chamber and keep the partial pressure of the gas in the chamber.

The first material and the second material used in the two-stage vacuum evaporation process may be obtained from the molecular structure of the perovskite layer 108, as described below.

"Perovskite" in the invention refers to the "perovskite structure" and not specifically to the perovskite material, $CaTiO_3$. In other words, "perovskite" relates to any material having the same type of crystal structure as calcium titanium oxide, and the divalent cation in the material is substituted by two separate monovalent cations. The perovskite structure has the general stoichiometry $ABX_3$, wherein "A" and "B" are cations and "X" is an anion. The A cation is divalent and the M cation is tetravalent. In the invention, the perovskite formula includes structure having three or four anions, which may be the same or different, and/or one or two organic cations, and/or two metal atoms carrying two or three positive charges.

For instance, in the formula $ABX_3$ of the present embodiment, B may include $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$; X is each independently selected from $Cl^-$, $Br^-$, $I^-$, $NCS^-$, $CN^-$, or $NCO^-$; A may be selected from hydrocarbons having 1 to 15 carbons and 1 to 20 heteroatoms, the heteroatom is at least one selected from N, O, and S; and A may also include $Li^+$, $Na^+$, $Cs^+$, $Rb^+$, or $K^+$.

In other words, the first and second materials used to fabricate perovskite may both be inorganic materials. Alternatively, an organic-inorganic hybrid perovskite formed by an inorganic material and an organic material is selected.

Since the organic-inorganic hybrid perovskite is a hybrid material, it has the characteristics of both an organic compound and an inorganic crystal. The inorganic component is formed by a framework bound by covalent and ionic interaction, and it may provide high carrier mobility. The organic component facilitates the self-assembly process of those materials. Moreover, the electronic properties of the organic-inorganic material may be adjusted by reducing the dimensionality of the organic component and the electronic coupling between the inorganic sheets.

The structure of the organic-inorganic hybrid perovskite is similar to a multi-layer quantum well structure, which has semiconductor inorganic sheets alternating with organic layer having a large energy gap.

The organic-inorganic hybrid perovskite material is, for instance, a molecular structure having one or more of formulas (I), (II), (III), and (IV).

$$A_2BX_4 \qquad (I)$$

$$ABX_3 \qquad (II)$$

$$ACX_4 \qquad (III)$$

$$DBX_4 \qquad (IV)$$

In formulas (I) to (IV), A represents a monovalent organic cation and D represents a divalent organic cation. A is selected from a compound formed by one, two, three, or four organic ammonia, and the compound includes a nitrogen-containing heteroring or ring system. A is selected from a hydrocarbon having up to 15 carbons and 1 to 20 heteroatoms, such as one or two positively-charged nitrogen atoms. D is selected from a hydrocarbon having up to 15 carbons or 2 to 20 heteroatoms, such as one or two positively-charged nitrogen atoms. Moreover, the heteroatoms may further be selected from N, O, and S. Moreover, the 1 to 20 heteroatoms of each of A and D may further be partially or completely halogenated.

In formulas (I), (II), and (IV), B is a divalent metal cation and selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$. B is preferably $Sn^{2+}$ or $Pb^{2+}$. In formula (III), C is a trivalent metal and selected from the group consisting of $Bi^{3+}$ and $Sb^{3+}$, for example.

In formulas (I) to (IV), X is an anionic compound, and preferably, formulas (I) to (IV) include three or four "X" each independently selected from $Cl^-$, $Br^-$, $I^-$, $NCS^-$, $CN^-$, $NCO^-$, or a combination thereof. When formula (II) has three "X", the perovskite material may include a combination of different halogens. For instance, "$X_3$" may be selected from $I_2Cl^{-3}$, $IBr_2^{-3}$, $Cl_xI_{(3-x)}^{-3}$, and $Br_{(3-x)}I_x^{-3}$ (wherein 0<x<3). The four anions in "$X_4$" may also be a combination of different halogens. X is preferably $Cl^-$, $Br^-$, or $I^-$.

B and C are preferably metal ions capable of passing through an octahedral anion coordination.

In the organic-inorganic hybrid perovskite material, the structure of formula (II) is preferred.

In a preferred embodiment, the organic-inorganic hybrid perovskite layer includes any one of the perovskite structures in formulas (V), (VI), (VII), (VIII), (IX), and (X).

$APbX_3$ (V)

$ASnX_3$ (VI)

$A_2PbX_4$ (VII)

$A_2SnX_4$ (VIII)

$DPbX_4$ (IX)

$DSnX_4$ (X)

In particular, A, D, and X are as defined above. X is preferably selected from $Cl^-$, $Br^-$, and $I^-$, and X is more preferably $I^-$.

In the invention, the organic-inorganic hybrid perovskite layer is, for instance, any perovskite structure in formulas (V) to (VIII), preferably formula (V) and/or formula (VI).

Moreover, A in any one of formulas (I) to (III) and formulas (V) to (VIII) is, for instance, selected from a monovalent cation of any compound of formulas (1) to (8).

$R^1$—$NH_3^+$ (1)

(2)

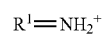

(3)

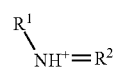

(4)

$R^1$=$NH_2^+$ (5)

(6)

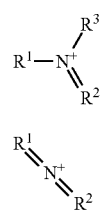

(7)

(8)

In particular, $R^1$, $R^2$, $R^3$, and $R^4$ each independently represent a C1 to C15 aliphatic group and a C4 to C15 aromatic substituent, and any one of, a plurality of, or all of the hydrogen in the substituent may be substituted by halogen. Moreover, in the case of two or more carbons, half of the carbons or less in the substituent may be substituted by a N, S, or O heteroatom. In any one of formula (2) to formula (8), two or more of the substituents ($R^1$, $R^2$, $R^3$, and $R^4$) may be covalently connected to one another for forming a substituted or unsubstituted ring or ring system.

In formulas (IV), (IX), and (X), D is, for instance, a divalent cation selected from any compound of formulas (9) and (10).

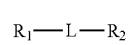 (9)

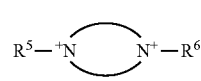 (10)

In formula (9), L is a single bond or an aliphatic or aromatic linker structure having 1 to 10 carbons, wherein any one of, a plurality of, or all of the hydrogen in L may be substituted by halogen, and half of the carbons or less in L may be independently substituted by a N, S, or O heteroatom. $R_1$ and $R_2$ each independently represent any one of the following substituents (11) to (16).

----$NH_3^+$ (11)

 (12)

 (13)

 (14)

 (15)

-continued

(16)

The dotted line in substituents (11) to (16) represents a bond connected to the linker structure L. The definition of each of $R^1$, $R^2$, and $R^3$ is as described in (1) to (8) above.

In the case that $R_1$ and $R_2$ are both different from substituent (11), $R_1$ and $R_2$ may be covalently connected to each another via the substituents $R^1$, $R^2$, and $R^3$ thereof. Moreover, in both substituents $R_1$ and $R_2$, any one of $R^1$, $R^2$, and $R^3$ may be covalently connected to L or the ring structure of compound (10).

In compound (10), the ring containing two positively-charged nitrogen atoms represents an aromatic ring or a ring system including 4 to 15 carbons and 2 to 7 heteroatoms, wherein the nitrogen atoms are heteroatoms of a ring or a ring system, and the remaining heteroatoms may respectively be selected from N, O, and S.

$R^5$ and $R^6$ each independently represent a substituent selected from hydrogen and, for instance, $R^1$ to $R^4$, and in addition to the 2 to 7 heteroatoms, a portion or all of the hydrogen may also be substituted by halogen.

If L is a single bond (i.e., L is absent), the substituents $R_1$ and $R_2$ are directly connected to form a N—N bond, as shown in formula (21).

If the number of carbons in L is not even, the number of heteroatoms is preferably less than the number of carbons. In the ring structure of formula (10), the number of ring heteroatoms is preferably less than the number of carbon atoms.

In the compound shown in formula (9), L is, for instance, an aliphatic or aromatic linker structure having 1 to 8 carbons, any one of a plurality of, or all of the hydrogen in L may be substituted by halogen, and 0 to 4 carbons in L may independently be substituted by a N, S, or O heteroatom. Preferably, L is an aliphatic or aromatic linker structure having 1 to 6 carbons, wherein any one of, a plurality of, or all of the hydrogen may be substituted by halogen, and 0 to 3 carbons in L may independently be substituted by a N, S, or O heteroatom. Moreover, in the compound shown in formula (9), the linker structure L, for instance, does not include a N, O, and/or S heteroatom.

In an embodiment, in the compound shown in formula (10), the ring containing two positively-charged nitrogen atoms represents an aromatic ring or a ring system including 4 to 10 carbons and 2 to 5 heteroatoms (containing two ring nitrogen atoms).

In another embodiment, the ring or ring system in the compound shown in formula (10) may exclude O or S heteroatoms. In yet another embodiment, in addition to the two heteroatoms, the ring or ring system in the compound shown of formula (10) is free of any N, O, and/or S heteroatoms. However, hydrogen may still be substituted by halogen.

Those having ordinary skill in the art should know that, if an aromatic linker structure, a compound, a substituent, or a ring includes 4 carbons, at least one ring heteroatom is included to provide the aromatic compound.

In an embodiment, $R^1$, $R^2$, $R^3$, and $R^4$ each independently represent a C1 to C8 aliphatic group and a C4 to C8 aromatic substituent, and any one of, a plurality of, or all of the hydrogen in the substituent may be substituted by halogen. Moreover, in the case of two or more carbons, half of the carbons or less in the substituent may be substituted by a N, S, or O heteroatom. Two or more substituents on the same cation may be covalently connected to one another for forming a substituted or unsubstituted ring or ring system.

In still yet another embodiment, $R^1$, $R^2$, $R^3$, and $R^4$ each independently represent a C1 to C6 aliphatic group and a C4 to C6 aromatic substituent, and any one of, a plurality of, or all of the hydrogen in the substituent may be substituted by halogen. Moreover, in the case of two or more carbons, half of the carbons or less in the substituent may be substituted by a N, S, or O heteroatom. Two or more substituents on the same cation may be covalently connected to one another for forming a substituted or unsubstituted ring or ring system.

In another embodiment, R', $R^2$, $R^3$, and $R^4$ each independently represent a C1 to C4 aliphatic group (preferably C1 to C3, more preferably C1 to C2), and any one of, a plurality of, or all of the hydrogen in the substituent may be substituted by halogen. Two or more substituents on the same cation may be covalently connected to one another and for forming a substituted or unsubstituted ring or ring system.

In yet another embodiment, $R^1$, $R^2$, $R^3$, and $R^4$ are each independently selected from a C1 to C10 alkyl group, a C2 to C10 alkenyl group, and a C2 to C10 alkynyl group, and if the alkyl group, the alkenyl group, and the alkynyl group include 3 or more carbons, they may be straight-chain, branched-chain, or rings. A plurality of or all of the hydrogen in the substituent may be substituted by halogen.

In still yet another embodiment, $R^1$, $R^2$, $R^3$, and $R^4$ are each independently selected from a C1 to C8 alkyl group, a C2 to C8 alkenyl group, and a C2 to C8 alkynyl group, and if the alkyl group, the alkenyl group, and the alkynyl group include 3 or more carbons, they may be straight-chain, branched-chain, or rings. A plurality of or all of the hydrogen in the substituent may be substituted by halogen.

In another embodiment, $R^1$, $R^2$, $R^3$, and $R^4$ are each independently selected from a C1 to C6 alkyl group, a C2 to C6 alkenyl group, and a C2 to C6 alkynyl group, and if the alkyl group, the alkenyl group, and the alkynyl group include 3 or more carbons, then the they may be straight-chain, branched-chain, or rings. A plurality of or all of the hydrogen in the substituent may be substituted by halogen.

In still yet another embodiment, $R^1$, $R^2$, $R^3$, and $R^4$ are each independently selected from a C1 to C4 alkyl group, a C2 to C4 alkenyl group, and a C2 to C4 alkynyl group, and if the alkyl group, the alkenyl group, and the alkynyl group include 3 or more carbons, they may be straight-chain, branched-chain, or rings. A plurality of or all of the hydrogen in the substituent may be substituted by halogen.

In yet another embodiment, $R^1$, $R^2$, $R^3$, and $R^4$ are each independently selected from a C1 to C3 alkyl group, a C2 to C3 alkenyl group, and a C2 to C3 alkynyl group, and if the alkyl group, the alkenyl group, and the alkynyl group include 3 carbons, they may be straight-chain, branched-chain, or rings. A plurality of or all of the hydrogen in the substituent may be substituted by halogen.

In another embodiment, $R^1$, $R^2$, $R^3$, and $R^4$ are each independently selected from a C1 to C4 alkyl group (preferably C1 to C3, more preferably C1 to C2). For instance, any one of $R^1$, $R^2$, $R^3$, and $R^4$ is a methyl group. Of course, the methyl group may also be partially or completely halogenated.

According to an embodiment of the invention, A and D are respectively a monovalent or a divalent cation and may be selected from a substituted or unsubstituted C5 to C6 ring containing one, two, or more nitrogen heteroatoms, wherein one (in terms of A) or two (in terms of D) in the nitrogen atoms is positively-charged. The substituent of the ring may be selected from halogen and the C1 to C4 alkyl group, the C2 to C4 alkenyl group, and the C2 to C4 alkynyl group defined above, and is preferably selected from the C1 to C3 alkyl group, the C3 alkenyl group, and the C3 alkynyl group defined above. Moreover, a heteroatom substituting one or more carbons thereof may be included, and the heteroatom is, for instance, selected from N, O, and S.

The divalent organic cation D is exemplified by a ring nitrogen atom having two positive charges, as shown in formula (10). The ring may be aromatic or aliphatic.

A and D may also be ring systems including two or more rings, wherein at least one is the substituted or unsubstituted C5 to C6 ring defined above. The oval circle in the compound of formula (10) may also represent a ring system including two or more rings, but preferably has two rings. Similarly, if A includes two rings, a ring heteroatom is further present, and the ring heteroatom is preferably uncharged.

In an embodiment, the organic cations A and D may include one (in terms of A), two (in terms of D), or more nitrogen atoms, but do not have O, S, or other heteroatoms, except for halogen substituting one or more hydrogen atoms in the cations A and D.

A is preferably a nitrogen atom having a positive charge. D is preferably a nitrogen atom having two positive charges.

A can, for instance, be selected from a ring or a ring system of formulas (17) and (18), and D can, for instance, be selected from a ring or a ring system of formulas (19) to (21).

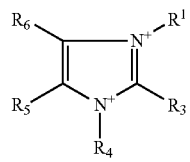
(17)

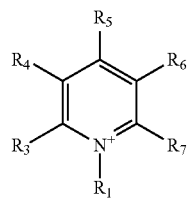
(18)

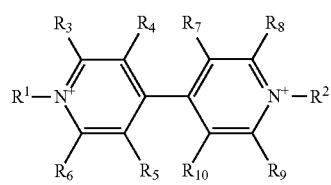
(19)

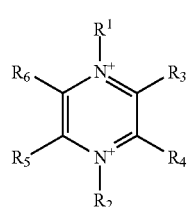
(20)

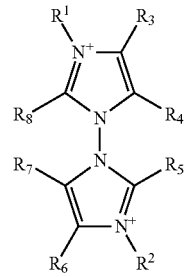
(21)

In particular, $R^1$ and $R^2$ are as defined above. $R_3$, $R_4$, $R_5$, $R_6$, $R_7$, $R_8$, $R_9$, and $R_{10}$ are each independently selected from hydrogen, halogen, and substituents defined by $R^1$ to $R^4$. Preferably, $R_3$ to $R_{10}$ are selected from hydrogen and halogen, preferably hydrogen.

In the organic cations A and D, hydrogen may be substituted by halogen such as F, Cl, I, and Br, preferably F or Cl. The substitution may be expected to be able to reduce the hydroscopic property of the perovskite layer.

Figure 3:
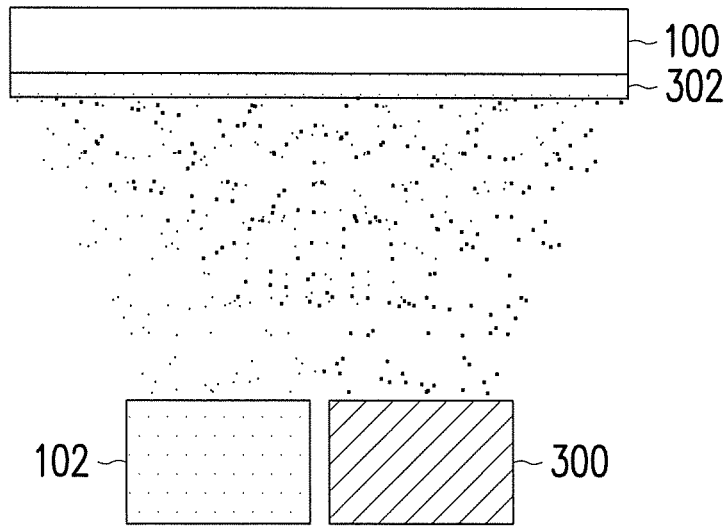
FIG. 3 is a cross-sectional schematic of a fabrication process of a perovskite solar cell according to another embodiment of the invention.

Moreover, according to the fabrication process of a perovskite solar cell of another embodiment of the invention, during the vacuum evaporation of the first material, an acceptor material may further be evaporated at the same time, as shown in FIG. 3.

In FIG. 3, in addition to the first material placed in the evaporation source 102, an acceptor material placed in an evaporation source 300 is also present, such as $C_{60}$, $C_{70}$, $C_{84}$, or PCBM. Moreover, the evaporation rate of each of the two materials may be precisely controlled when co-evaporation is performed, such that a formed film layer 302 has a controlled component ratio.

Moreover, after the perovskite layer 108 is formed, a post-annealing process may further be performed if needed such that the perovskite layer is completely crystallized and the remaining second material is removed.

Figure 4:
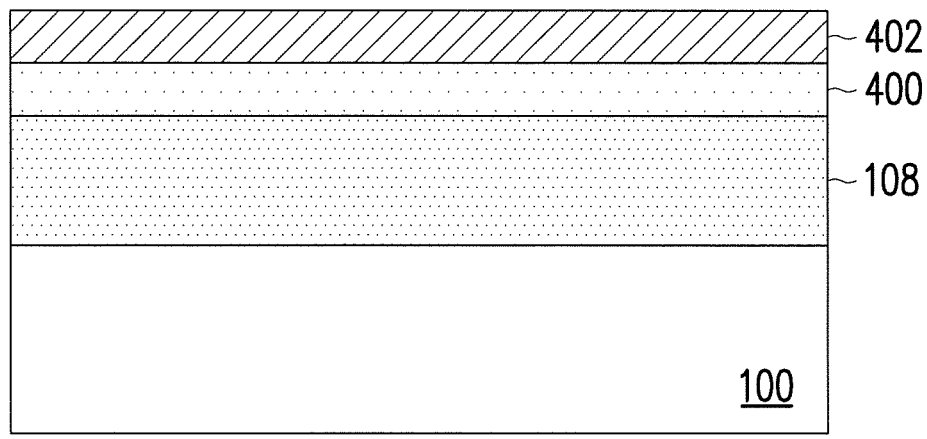
FIG. 4 is a schematic of a perovskite solar cell obtained according to an embodiment of the invention.

After the fabrication of the perovskite layer 108 is complete, an electron transport layer (ETL) 400 may be formed on the perovskite layer 108 and an electrode layer 402 may be formed on the ETL 400 to obtain the structure of FIG. 4.

The ETL 400 is, for instance, Bphen, BCP, NTCDA, TPBi, TmPyPB, $Alq_3$, PBD, B3PYPB, or DPPS.

A vacuum evaporation technique may similarly be used for the forming of the electrode layer 402, and the electrode layer 402 generally includes one or more selected from the group consisting of Ag, Al, Ca, Pt, Au, Ni, Cu, In, Ru, Rd, Rh, Ir, Os, C, a conductive polymer, or a combination thereof. The conductive polymer is, for instance, selected from two or more polymer materials including polyaniline, polypyrrole, polythiophene, polybenzene, polyacetylene, polyethylenedioxythiophene, polypropylene-dioxythiophene, and a combination thereof.

Moreover, in an embodiment of the invention, the organic-inorganic hybrid perovskite layer 108 may be a single-layer or a multi-layer. In the case of a multi-layer, the materials may be the same or different, and a single-layer is preferred. The solar cell has two continuous organic-inorganic hybrid perovskite layers, and the two organic-inorganic hybrid perovskite layers may be formed by the same molecular structure or different molecular structures. In the case of two organic-inorganic hybrid perovskite layers, light of different frequency bands may be absorbed.

In the case of a plurality of layers of different organic-inorganic hybrid perovskite layers, the perovskite structure may be different components. A, B, C, D, and X in the structures of formulas (I) to (IX) may all be changed to obtain perovskite layers having different characteristics. In particular, A, B, C, D, or X in the film layer formed subsequently may be changed so as to adjust the bandgap of the materials.

Since the perovskite solar cell of the invention is a solid-state solar cell, an electrolyte is not needed.

In an embodiment, the perovskite solar cell may further be connected to a current collector to collect electricity generated by the solar cell. The current collector is, for instance, an electrically conductive metal foil such as a titanium foil or a zinc foil. In the case that a non-transparent electrically conductive material is used as the current collector, the non-transparent electrically conductive material may be disposed on a side surface so as not to block light entering the solar cell.

An experimental example is provided below to verify the efficacy of the solar cell of the invention, but the invention is not limited thereto.

Experimental Example

Figure 5A:
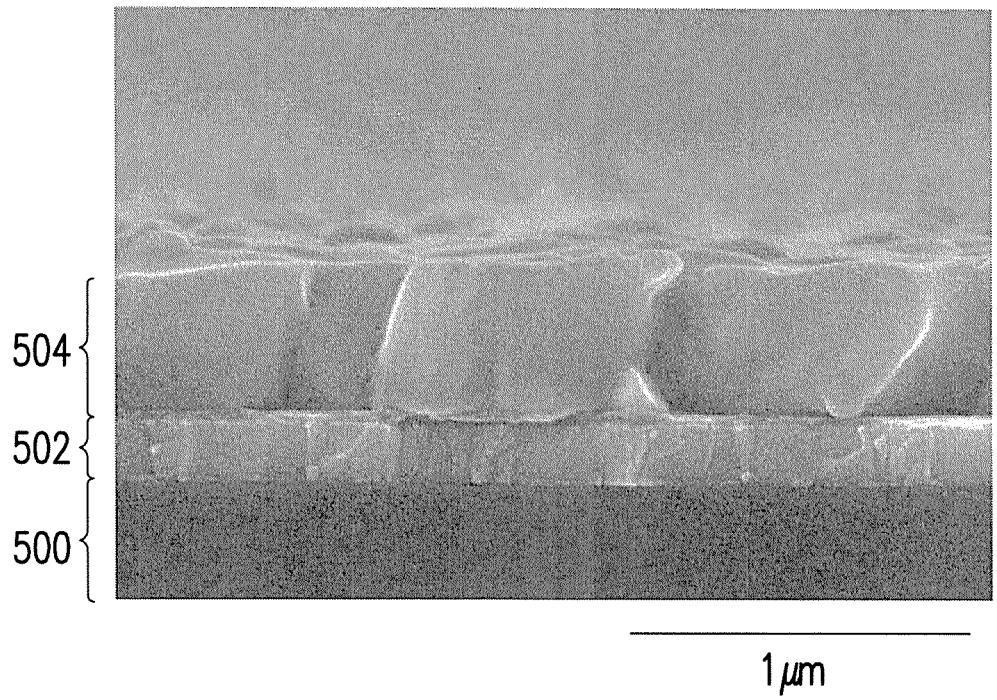
FIG. 5A is an SEM illustrating a side view of a perovskite layer in the experimental example.
Figure 5B:
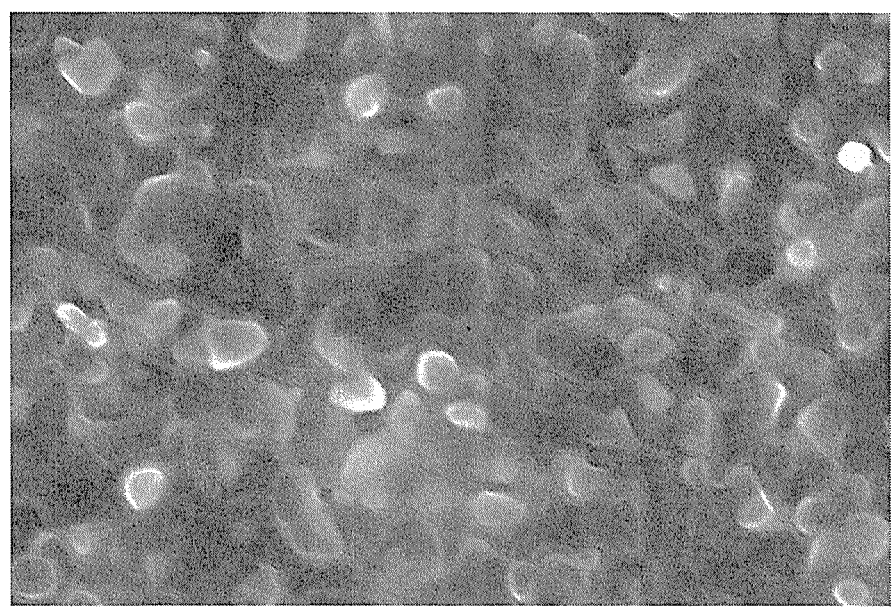
FIG. 5B is an SEM illustrating a top view of a perovskite  layer in the experimental example.

First, a layer of PEDOT:PSS (poly(3,4-ethylendioxythiophene): poly(styrenesulfonate) thin film is spin-coated on an ITO glass as an HTL, and then a layer of $PbCl_2$ film having a thickness of about 150 nm is vacuum evaporated on the ITO glass on which PEDOT:PSS is formed, and the crystal structure thereof has a domain size of about 100 nm to 200 nm. Then, under the condition that the temperature of the ITO glass is greater than room temperature (65° C. to 85° C.), $CH_3NH_3I$ is vacuum evaporated on the $PbCl_2$ film, and $PbCl_2$ is reacted with the $CH_3NH_3I$ in situ during the process to foul' a perovskite layer ($CH_3NH_3PbI_{3-x}Cl_x$, wherein 0<x<3). Then, a post-annealing process is performed in vacuum at a temperature of about 100° C. such that the perovskite layer is completely crystallized and the remaining $CH_3NH_3I$ is removed. Then, side view 5A and top view 5B are obtained via SEM, and it may be seen from FIG. 5A that 500 is glass, 502 is an ITO layer coated with PEDOT:PSS, and 504 is a perovskite layer.

Then, C60/Bphen used as an ETL and Ca/Ag used as an electrode layer (cathode) are formed on the perovskite layer via vacuum evaporation in order so as to complete the fabrication of the perovskite solar cell of the experimental example. Bphen is 4,7-diphenyl-1,10-phenanthroline and is used as a buffer layer.

Figure 6:
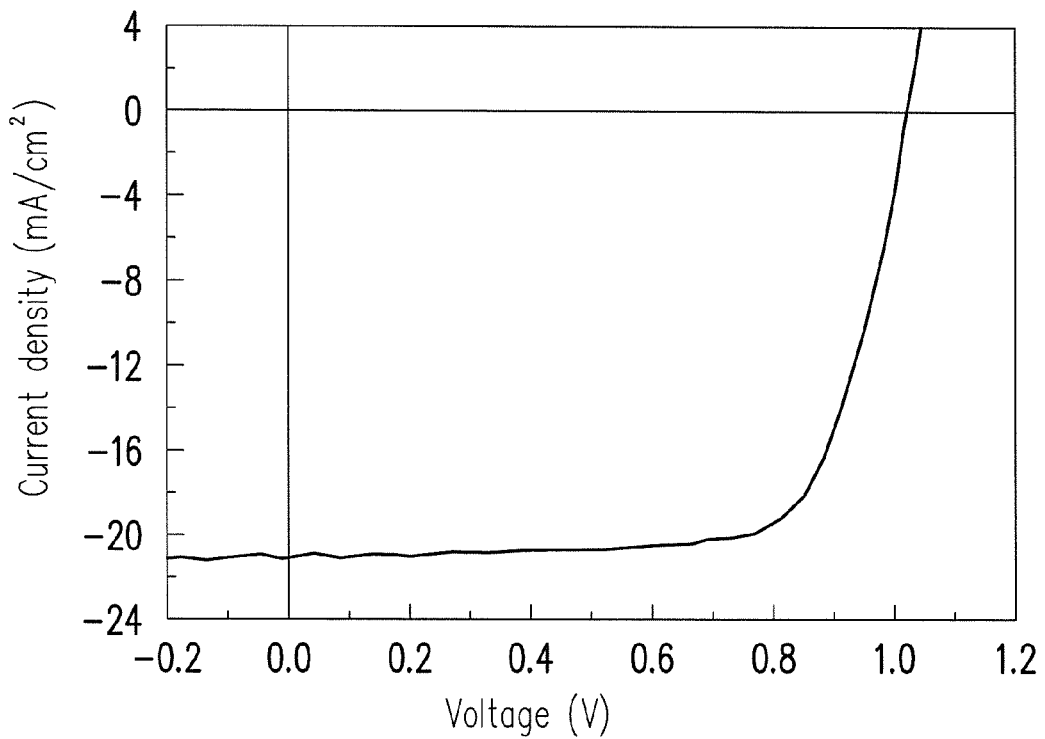
FIG. 6 is a graph of voltage-current characteristic of a perovskite solar cell of the experimental example.

After the fabrication of the perovskite solar cell is complete, the solar cell is irradiated by a sunlight simulator used as a light source, and photocurrent generated under different voltages is measured by using a voltage/current generator. The results are shown in the voltage-current characteristic graph of FIG. 6. At the same time, the photoelectric conversion efficiency of the battery is calculated according to the results of FIG. 6, and the measurement results of photoelectric characteristic are as shown in Table 1, which shows a very high photoelectric conversion efficiency.

TABLE 1

| $J_{SC}$ (mA/cm$^2$) | $V_{OC}$ (V) | FF (%) | $\eta_{PCE}$ (%) |
|---|---|---|---|
| 20.9 | 1.02 | 72.2 | 15.4 |

Figure 7:
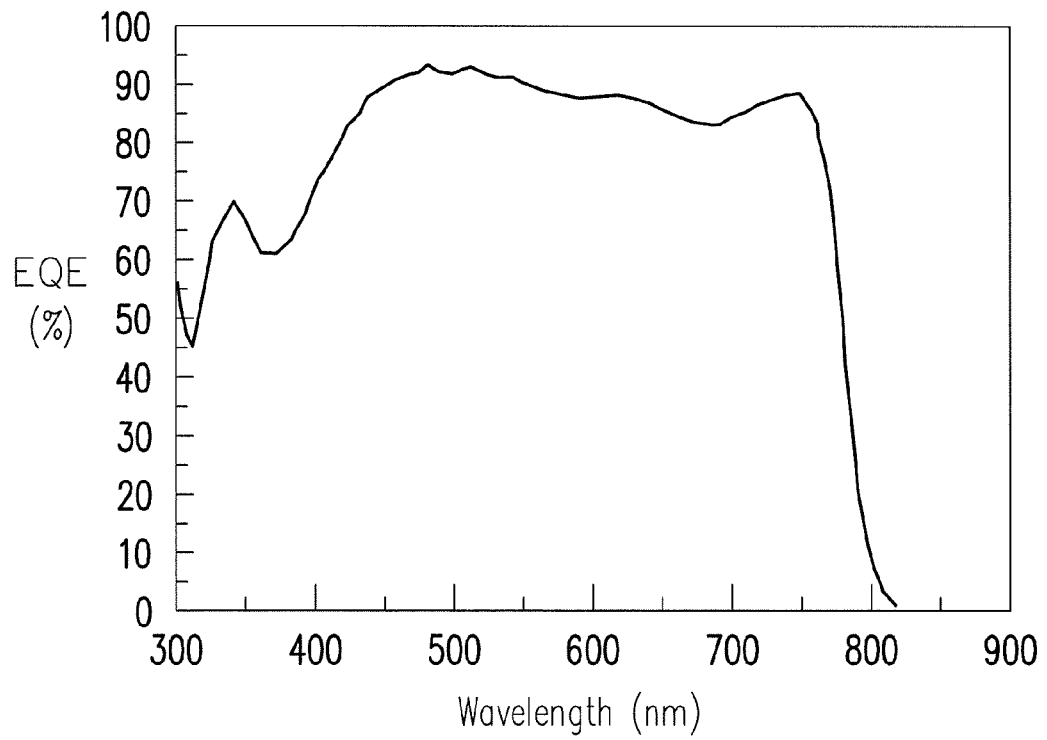
FIG. 7 is a graph of the measurement of external quantum efficiency of a perovskite solar cell of the experimental example.

Moreover, results of external quantum efficiency (EQE) show that the photoelectric conversion of the solar cell of the experimental example under the irradiation of an all-optical wavelength is extremely favorable, as shown in FIG. 7.

Based on the above, in the invention, the perovskite layer is formed by a two-stage vacuum evaporation process. As a result, not only may all of the disadvantages of a wet process be avoided, a solar cell having high efficiency may further be fabricated in a stable manner. Moreover, the invention has the characteristics of, for instance, simple process, low fabrication cost, low energy consumption, lightweight materials, large-area fabrication, and flexibility.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A method of fabricating a perovskite solar cell, comprising:
    forming a hole transport layer on a transparent electrically conductive substrate;
    forming a perovskite layer on the hole transport layer via a two-stage vacuum evaporation process;
    forming an electron transport layer on the perovskite layer; and
    forming an electrode layer on the electron transport layer, wherein
    the two-stage vacuum evaporation process comprises:
        vacuum evaporating a first material on the hole transport layer; and
        vacuum evaporating a second material on the first material so as to react the first material with the second material and form the perovskite layer.

2. The method of claim 1, wherein the perovskite layer comprises a structure of formula (II):

$$ABX_3 \qquad (II)$$

wherein A comprises $Li^+$, $Na^+$, $Cs^+$, $Rb^+$, or $K^+$, or is selected from hydrocarbons having 1 to 15 carbons and 1 to 20 heteroatoms, the heteroatom is at least one selected from N, O, and S; B comprises $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$ $Eu^{2+}$, or $Yb^{2+}$; and X is each independently selected from $Cl^-$, $Br^-$, $I^-$, $NCS^-$, $CN^-$, or $NCO^-$.

3. The method of claim 2, wherein the perovskite layer is $CH_3NH_3PbX_3$, wherein X is each independently selected from $Cl^-$, $Br^-$, or $I^-$.

4. The method of claim 1, wherein the first material comprises $PbI_2$, $PbCl_2$, $PbBr_2$, $SnI_2$, $SnCl_2$, $SnBr_2$, $GeI_2$, $GeCl_2$, or $GeBr_2$.

5. The method of claim 1, wherein the second material comprises $CH_3NH_3I$, $CH_3NH_3Br$, $NH_4I$, $NH_4IBr$, $HC(NH_2)_2I$, CsI, CsBr, RbI, RbBr, KI, KBr, NaI, NaBr, LiI, or LiBr.

6. The method of claim 1, wherein a method of vacuum evaporating the second material on the first material comprises vertical evaporation or horizontal evaporation.

7. The method of claim 1, wherein during vacuum evaporating the second material, a temperature of the transparent electrically conductive substrate is above room temperature.

8. The method of claim 1, wherein during vacuum evaporating the second material, a temperature of the transparent electrically conductive substrate is between 40° C. and 200° C.

9. The method of claim 1, further comprising, during vacuum evaporating the first material on the hole transport layer, evaporating an acceptor material at the same time.

10. The method of claim 1, further comprising, after forming the perovskite layer, performing a post-annealing process.

11. The method of claim 1, further comprising, during vacuum evaporating the second material, using a shutter to prevent the second material directly depositing on the first material.

12. The method of claim 1, further comprising, during vacuum evaporating the second material, heating walls of a chamber in which the transparent electrically conductive substrate is placed.

* * * * *